United States Patent
Mebarki et al.

(10) Patent No.: US 9,337,051 B2
(45) Date of Patent: May 10, 2016

(54) METHOD FOR CRITICAL DIMENSION REDUCTION USING CONFORMAL CARBON FILMS

(71) Applicant: Applied Materials, Inc., Santa Clara, CA (US)

(72) Inventors: Bencherki Mebarki, Santa Clara, CA (US); Bok Hoen Kim, San Jose, CA (US); Deenesh Padhi, Sunnyvale, CA (US); Li Yan Miao, San Francisco, CA (US); Pramit Manna, Santa Clara, CA (US); Christopher Dennis Bencher, Cupertino, CA (US); Mehul B. Naik, San Jose, CA (US); Huixiong Dai, San Jose, CA (US); Christopher S. Ngai, Burlingame, CA (US); Daniel Lee Diehl, Chiba (JP)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/799,374

(22) Filed: Jul. 14, 2015

(65) Prior Publication Data
US 2016/0049305 A1 Feb. 18, 2016

Related U.S. Application Data

(60) Provisional application No. 62/037,495, filed on Aug. 14, 2014.

(51) Int. Cl.
*H01L 21/00* (2006.01)
*H01L 21/308* (2006.01)
(Continued)

(52) U.S. Cl.
CPC ........ *H01L 21/3088* (2013.01); *H01L 21/0276* (2013.01); *H01L 21/02115* (2013.01); *H01L 21/02266* (2013.01); *H01L 21/02274* (2013.01); *H01L 21/3081* (2013.01);
(Continued)

(58) Field of Classification Search
CPC ................. H01L 21/02115; H01L 21/02126; H01L 21/3088; H01L 21/3081; H01L 21/3086; H01L 21/31144; H01L 21/31111
See application file for complete search history.

(56) References Cited

U.S. PATENT DOCUMENTS

| 2006/0166106 A1 | 7/2006 | Chandrachood et al. |
| 2009/0286402 A1 | 11/2009 | Xia et al. |

(Continued)

OTHER PUBLICATIONS

International Search Report and Written Opinion of related application PCT/US2015/040420.

*Primary Examiner* — Richard Booth
(74) *Attorney, Agent, or Firm* — Patterson & Sheridan, LLP

(57) ABSTRACT

Embodiments of the disclosure generally provide a method of forming a reduced dimension pattern in a hardmask that is optically matched to an overlying photoresist layer. The method generally comprises of application of a dimension shrinking conformal carbon layer over the field region, sidewalls, and bottom portion of the patterned photoresist and the underlying hardmask at temperatures below the decomposition temperature of the photoresist. The methods and embodiments herein further involve removal of the conformal carbon layer from the bottom portion of the patterned photoresist and the hardmask by an etch process to expose the hardmask, etching the exposed hardmask substrate at the bottom portion, followed by the simultaneous removal of the conformal carbon layer, the photoresist, and other carbonaceous components. A hardmask with reduced dimension features for further pattern transfer is thus yielded.

19 Claims, 10 Drawing Sheets

(51) Int. Cl.
*H01L 21/311* (2006.01)
*H01L 21/02* (2006.01)
*H01L 21/027* (2006.01)

(52) U.S. Cl.
CPC ..... *H01L 21/3086* (2013.01); *H01L 21/31111* (2013.01); *H01L 21/31144* (2013.01)

(56) References Cited

U.S. PATENT DOCUMENTS

| | | |
|---|---|---|
| 2010/0093187 A1 | 4/2010 | Lee et al. |
| 2010/0291713 A1 | 11/2010 | Lee et al. |
| 2012/0170102 A1* | 7/2012 | Payne et al. ............ 359/291 |
| 2013/0344699 A1 | 12/2013 | Chiba |

* cited by examiner

METHOD FOR CRITICAL DIMENSION REDUCTION USING CONFORMAL CARBON FILMS

CROSS-REFERENCE TO RELATED APPLICATIONS

This application claims benefit of U.S. provisional patent application Ser. No. 62/037,495, filed Aug. 14, 2014, the entirety of which is incorporated herein by reference.

BACKGROUND

1. Field

Embodiments of the present disclosure generally relate to the fabrication of integrated circuits and particularly to a method for creating reduced critical dimensions in a feature formed in a hardmask used for pattern transfer.

2. Description of the Related Art

Reducing the size of integrated circuits (ICs) results in improved performance, increased capacity, and/or reduced cost. Each size reduction requires more sophisticated techniques to form the ICs. Photolithography is commonly used to pattern ICs on a substrate. An exemplary feature of an IC is a line of a material which may be a metal, semiconductor, or insulator. Line width is the width of the line and the spacing is the distance between adjacent lines. Pitch is defined as the distance between a same point on two adjacent lines. The pitch is equal to the sum of the line width and the spacing. However, due to factors such as optics and light or radiation wavelength, photolithography techniques have a minimum pitch below which a particular photolithographic technique may not reliably form features. Thus, the minimum pitch of a photolithographic technique can limit feature size reduction. Similarly, patterning tools designed to create vias or line interconnects 100 nm or wider are not commonly able to create smaller vias. Therefore, as devices shrink to these small dimensions, current lithography processes are challenged to create patterns with the required critical dimensions (CD). To avoid having to redesign the current lithography tools, new methods are needed to shrink the critical dimension of IC lines and via interconnects etched into a substrate.

Currently, conformal layers used to shrink critical dimensions, such as a reduced dimension pattern in a hardmask, are formed by atomic layer deposition (ALD) using an etchable material such as silicon oxide. However, the deposited material quality can be difficult to control, resulting in low density, poor mechanical strength, and degraded chemical resistance to subsequent etching chemistries. High stresses in ALD oxides can also lead to buckling and deformation of underlayers, as well as delamination due to poor adhesion and mismatches in chemical compatibility. Additionally, oxide materials require a wet clean process for removal after etching. Wet clean is an isotropic process which typically leads to CD loss and under-cut issues.

Plasma enhanced chemical vapor deposition (PECVD) of carbon films is an alternative for forming a reduced dimension pattern in a hardmask material due to the formed carbon layer's etch selectivity and easy removal using conventional dry ashing plasma processes. Generally, deposition of carbon films for producing reduced dimension patterns in a hardmask is practiced at temperatures exceeding 120° C. to achieve acceptable step coverage, conformality with minimum pattern loading effect, gap filling, and planarization on high aspect ratio structures. These conventional carbon deposition processes have limited use due to the high temperatures that are required to form these types of layers. The high temperature PECVD deposition of conformal carbon thus prevents its disposition onto soft carbonaceous materials such as photoresists that have a decomposition temperature typically less than 120° C.

Given the current state of the art, there is a need for a low temperature method for the formation of carbon containing film directly upon a patterned photoresist layer, followed by removal by a dry ashing process.

SUMMARY

Embodiments of the disclosure generally provide a method of forming a reduced dimension pattern in a hardmask that is optically matched to a photoresist layer. The method generally comprises of application of a dimension shrinking conformal carbon layer over the field region, sidewalls, and bottom portion of the patterned photoresist and the underlying hardmask at temperatures below the decomposition temperature of the photoresist. The method and embodiments disclosed herein further involve removal of the conformal carbon layer from the bottom portion of the patterned feature formed in the photoresist by an etch process to expose the hardmask surface, etching the exposed hardmask substrate at the bottom portion, followed by the simultaneous removal of the conformal carbon layer, the photoresist, and other carbonaceous components. A hardmask with reduced CD dimension features for further pattern transfer is thus yielded.

Embodiments of the disclosure may further provide a method of forming a reduced dimension pattern in a hardmask. The method may include forming a patterned photoresist layer on a hardmask layer and depositing a conformal carbon layer on the patterned photoresist by a plasma process. The conformal carbon layer may be disposed over a field region and sidewalls and a bottom portion of a feature formed in the patterned photoresist. The method may further include removing the conformal carbon layer from the bottom portion by an etch process to expose a portion of the hardmask layer, etching the exposed portion of the hardmask layer to form a recess in the hardmask layer, and removing the remaining portions of the conformal carbon layer and patterned photoresist layer simultaneously by a plasma ashing method.

Embodiments of the disclosure may further provide a method of forming a reduced dimension pattern on a hardmask. The method may include providing a substrate comprising a patterned photoresist on a hardmask to a plasma chamber and introducing propylene gas, ammonia gas, a plasma-initiating gas, and a dilution gas into the processing chamber; wherein a volumetric flow rate of the hydrocarbon source and the nitrogen source is in a ratio from about 50:1 to about 5:1. The method may further include generating a plasma in the processing chamber. wherein the plasma is generated by applying RF power at a power density of from about 0.01 W/cm$^2$ to about 10 W/cm$^2$, and depositing a conformal carbon layer comprising nitrogen-doped amorphous carbon over the patterned photoresist and the hardmask. The photoresist and a surface of the hardmask may each have a refractive index between 1.6 and 1.7 and the coefficient of extinction may be between 0.00 and 0.12 at a wavelength of 193 nm. The hardmask may include SiO$_w$N$_x$:H$_y$. Furthermore, the substrate temperature may be maintained at less than 100° C. while depositing the conformal carbon layer.

Embodiments of the disclosure may further provide a method of forming a reduced dimension pattern on a hardmask. The method may include providing a substrate comprising a patterned photoresist on a hardmask to a plasma chamber. The substrate temperature may be maintained at less than 100° C. The method may further include introducing propylene gas, ammonia gas, a plasma-initiating gas, and a dilution gas into the processing chamber. A volumetric flow rate of the hydrocarbon source and the nitrogen source may be in a ratio from about 50:1 to about 5:1. The method may also include generating a plasma in the processing chamber. The plasma may be generated by applying RF power at a power density of from about 0.01 W/cm$^2$ to about 10 W/cm$^2$. The method may also include depositing a conformal carbon layer comprised of nitrogen-doped amorphous carbon layer over the field region, sidewalls, and a bottom portion of the pattern formed by the patterned photoresist and the hardmask. The photoresist may have a refractive index between 1.6 and 1.7 and the coefficient of extinction may be between 0.00 and 0.12 at a wavelength of 193 nm. The hardmask may be of the general chemical formula $SiO_wN_x:H_y$. The hardmask optical properties may sufficiently match the optical properties of the photoresist, at a lithography exposure wavelength of the photoresist.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure relate to a process of forming a conformal carbon layer to produce reduced dimension features in a hardmask structure. In some configurations, the hardmask structure may be optically matched to an overlying photoresist layer. In various embodiments, a conformal carbon layer may be deposited over features of a patterned photoresist layer at temperatures below the decomposition temperature of the photoresist, thus preserving the chemical, physical, and mechanical properties of the photoresist layer. The deposited carbon layer generally features good adhesion, chemical compatibility, good step coverage, and high etch selectivity.

The method and embodiments may further involve removal of the conformal carbon layer from the bottom portion of the patterned photoresist and the hardmask by an etch process to expose the hardmask, etching the exposed hardmask substrate at the bottom portion, followed by the simultaneous removal of the photoresist, conformal carbon layer, and other carbonaceous components. The simultaneous removal of the carbonaceous components eliminates the need for wet clean operations to remove these carbonaceous components, and thus reducing the cost and complexity of forming a hardmask with reduced dimension features for further pattern transfer.

Figure 1A:
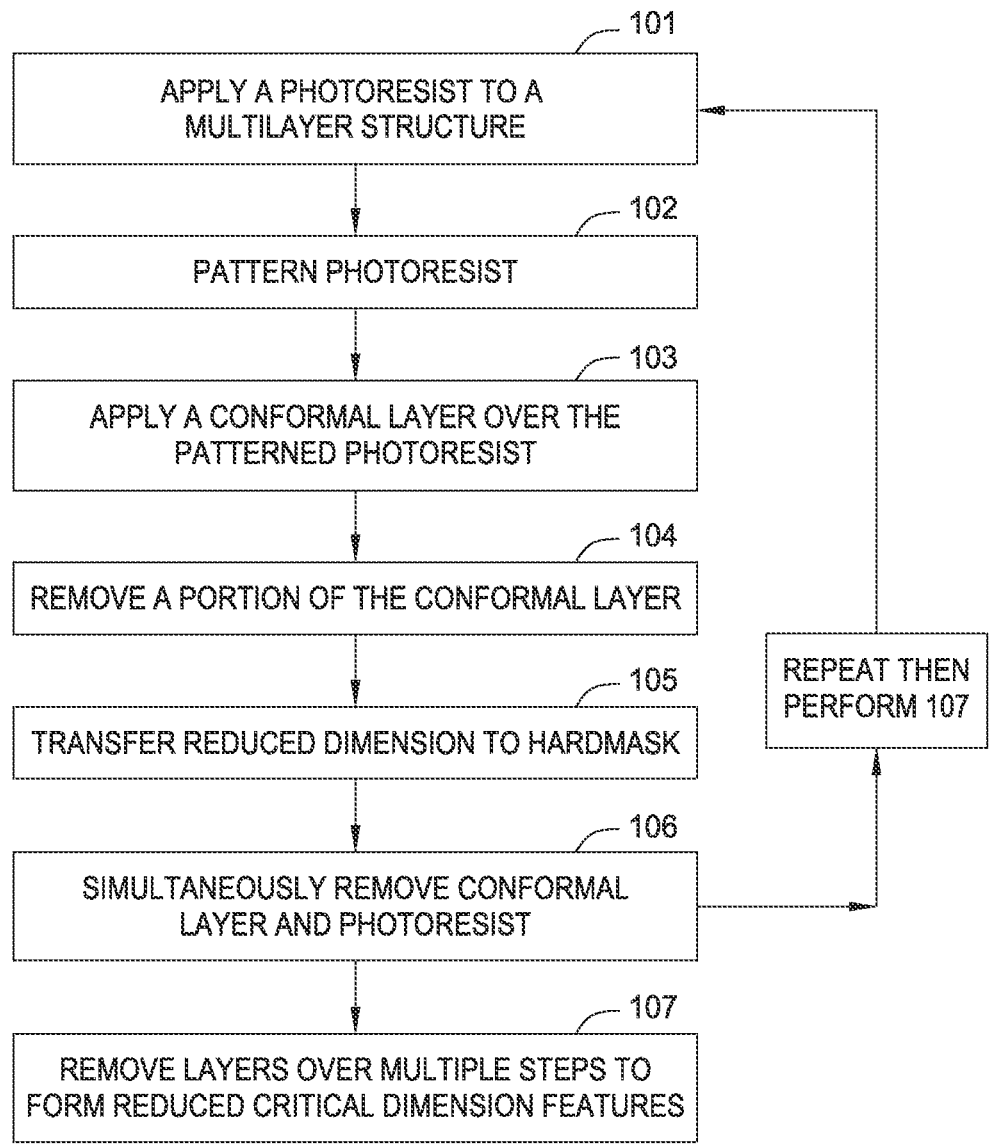
FIG. 1A is a flowchart depicting operations associated with an exemplary patterning method according to one embodiment of the disclosure.
Figure 1B:
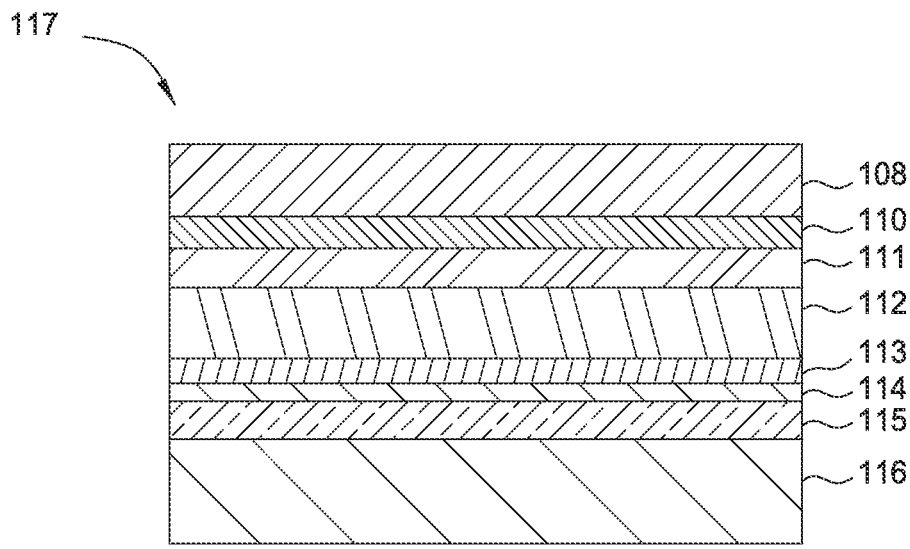
FIGS. 1B-1I illustrate cross-sectional views representing a patterning method as set forth by FIG. 1A according to an embodiment of the disclosure.
Figure 1C:
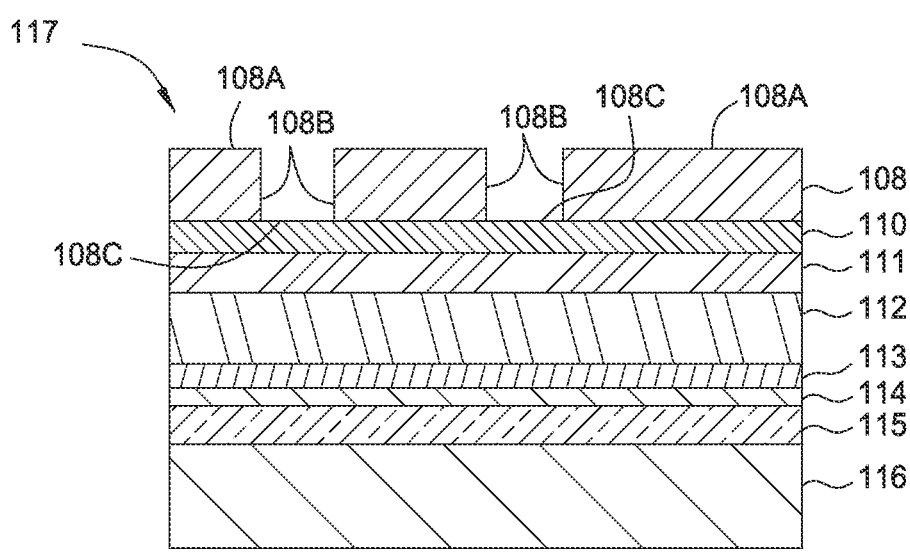

FIG. 1A is a flow diagram illustrating method 100 according to one embodiment of the disclosure. FIGS. 1B-1I illustrate cross-sectional views representing the patterning process as set forth in FIG. 1A, and graphically illustrate multilayer substrate 117 at various stages of the method 100. FIG. 1B illustrates a number of possible layers comprising the multilayer substrate 117. In some embodiments, the multilayer substrate 117 may also include a plurality of alternating oxide and nitride materials (i.e., oxide-nitride-oxide (ONO)), one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or updoped amorphous silicon alternating with doped amorphous silicon deposited on a surface of the substrate. The multilayer substrate 117 may be a layer stack comprising one or more of the following: crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof. As shown in FIGS. 1B-1H, an oxide layer 114 may be formed on the active layer 115. Furthermore, a titanium nitride layer 113 may be formed on the oxide layer 114. Multilayer substrate 117 may also comprise layers containing carbonaceous materials such as photoresists, anti-reflective coatings, and other spin-on coatings.

At the beginning of the method 100, the multilayer substrate 117 is provided to a plasma processing chamber, wherein the multilayer substrate 117 resides on a temperature controlled substrate holder or chuck (e.g., electrostatic chuck). The multilayer substrate 117 is then equilibrated to a temperature less than the decomposition temperature of the photoresist 108. The photoresist 108 is disposed over the hardmask layer 110, per box 101, and is patterned using a lithography type process, per box 102.

The photoresist 108 may be a polymer material sensitive to a certain wavelength of electromagnetic radiation, and may be applied through a spin coating process or a CVD process. In some embodiments, the photoresist 108 is a carbon-based polymer sensitive to ultraviolet light, such as a phenolic resin, an epoxy resin, or an azo napthenic resin. The photoresist 108 may be a positive or a negative photoresist. Preferred positive photoresists may be selected from the group consisting of a 248 nm photoresist, a 193 nm photoresist, a 157 nm photoresist, and a phenolic resin matrix with a diazonapthoquinone sensitizer. Preferred negative photoresists may be selected from the group consisting of poly-cis-isoprene and polyvinylcinnamate. Notably, photoresist materials will decompose at temperatures much lower than the other non-carbonaceous layers present in the multilayer substrate 117. Typical photoresist decomposition temperatures range from 100° C. to 150° C., resulting in compromised patterning performance and poor process yield.

Figure 1D:
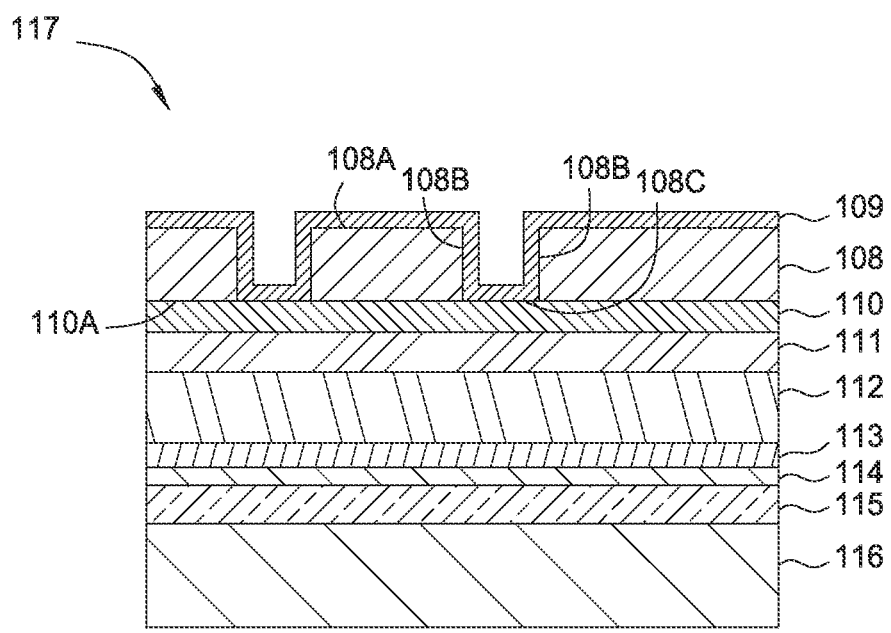

Per box 103 of FIG. 1A, and as illustrated by FIG. 1D, conformal carbon film layer 109 is deposited over the field region 108A, sidewalls 108B, and the bottom portion 108C formed by the patterned photoresist 108 and the reduced dimension feature 110A of the reduced dimension pattern transfer hardmask layer 110. The conformal carbon film layer 109 may be disposed over the patterned photoresist 108 by a PECVD process from gaseous precursors that are provided to a reactor containing the multilayer substrate 117.

Embodiments of the present disclosure may be performed using any suitable processing chamber, such as plasma enhanced chemical vapor deposition (PECVD) chamber. The processing chamber may be incorporated into a substrate processing system with a temperature controlled chuck to hold the multilayer substrate 117. Examples of suitable systems include the CENTURA® systems which may use a DxZ™ processing chamber, PRECISION 5000® systems, PRODUCER™ systems, PRODUCER™ GT™, and the PRODUCER™ SE™ processing chambers which are commercially available from Applied Materials, Inc., Santa Clara, Calif. It is contemplated that other processing systems, including those available from other manufacturers, may be adapted to practice the embodiments described herein.

Carbon containing precursors used to form conformal carbon film layer 109 by PECVD are comprised of the hydrocarbons generally chosen from the alkanes, alkenes, and alkynes. Inorganic nitrogen containing precursors may be used to nitrogen dope the preferred conformal carbon film layer 109, and include ammonia ($NH_3$), nitrous oxide ($N_2O$), or hydrazine ($N_2H_2$). Alternatively, nitrogen containing carbon precursors such as amines and the like may be used and can be described by the formula $C_xH_yN_z$, where x has a range of between 1 and 12, y has a range of between 2 and 20, and z has a range of between 1 and 10. Suitable nitrogen containing hydrocarbon compounds may include one or more of the following compounds: methylamine, dimethylamine, trimethylamine (TMA), triethylamine, aniline, quinoline, pyridine, acrylonitrile, and benzonitrile.

The plasma-initiating gas may be introduced into the PECVD chamber before and/or at the same time as the hydrocarbon compound, and a plasma is initiated to begin deposition. The plasma-initiating gas may be a high ionization potential gas including, and not limited to, helium gas, hydrogen gas, nitrogen gas, argon gas, and combinations and mixtures thereof. The plasma-initiating gas may also be a chemically inert gas, such as helium gas, nitrogen gas, or argon gas. Suitable ionization potentials for gases are from about 5 eV (electron potential) to 25 eV. The plasma-initiating gas may be introduced into the PECVD chamber prior to the nitrogen containing hydrocarbon source and/or the hydrocarbon source, which allows stable plasma to be formed and reduces the chances of arcing.

An inert gas may be used as a dilution gas or a carrier gas to flow with the hydrocarbon source, the plasma-initiating gas, the nitrogen containing hydrocarbon source, or combinations thereof. Suitable dilution gases may include argon (Ar), helium (He), hydrogen ($H_2$), nitrogen ($N_2$), ammonia ($NH_3$), noble gases such as krypton (Kr), xenon (Xe), or any combinations thereof. In some embodiments, argon is used as the dilution gas for reasons of economy. Argon (Ar), helium (He), and/or nitrogen ($N_2$) may be used to control the density and deposition rate of the conformal carbon layer. In other embodiments, the addition of $H_2$ and/or $NH_3$ can be used to control the hydrogen ratio of the conformal carbon layer. In cases where alkynes such as acetylene ($C_2H_2$) or alkenes such as propylene may be used as hydrocarbon source, the carrier gas may not be used during the deposition.

During processing, a hydrocarbon source, a nitrogen-containing gas and a dilution gas may be introduced into a PECVD chamber to deposit a conformal carbon layer that is nitrogen-doped. The hydrocarbon source may be any suitable hydrocarbon compound as discussed above. If a liquid hydrocarbon source is used, the precursor flow may be between about 50 mg/min to about 1000 mg/min. If a gaseous hydrocarbon source is used, the precursor flow may be between about 100 sccm to about 5000 sccm, for example about 200 sccm to about 600 sccm. If a carrier gas is used, the carrier flow may be between about 500 sccm and about 10000 sccm. The plasma-initiating gas may be any suitable plasma-initiating gas as discussed above, and flowed at a flow rate from about 0 sccm to about 50,000 sccm, for example, between about 400 sccm to about 8,000 sccm. The dilution gas may be any dilution gas as described above and supplied at a flow rate from about 0 sccm to about 5,000 sccm, for example about 500 sccm to about 1,000 sccm.

In various embodiments, the nitrogen-containing gas may be introduced at a nitrogen-containing gas to hydrocarbon source ratio of about 1:100 to about 20:1, for example about 1:40 to about 10:1. The dilution gas may be introduced at a dilution gas to hydrocarbon source ratio of about 2:1 to about 40:1, for example about 20:1 to about 30:1. In one embodiment, a volumetric flow rate of hydrocarbon source:nitrogen-containing gas:plasma-initiating gas:dilution gas is in a ratio of, for example about 1:1:0.5:20, for example about 1:0.5:0.5:20, for example about 1:0.2:0.5:20, for example about 1:0.2:0.5:30, for example about 1:0.2:0.5:40. In one embodiment, a volumetric flow rate of hydrocarbon source:plasma-initiating gas:dilution gas is in a ratio of about 1:0.5:20 to about 1:10:20, for example about 1:0.8:20, about 1:1:20, about 1:1.5:20, about 1:1.8:20, about 1:2:20, about 1:2.5:20, about 1:3:20, about 1:3.5:20, about 1:4:20, about 1:4.5:20, about 1:5:20, about 1:5.5:20, about 1:6:20, about 1:8:20, about 1:10:20 or above, for example about 1:15:20.

If a nitrogen-containing hydrocarbon source (as described above) is used, the nitrogen-containing hydrocarbon gas may be flowed at a flow rate from about 10 sccm to about 2,000 sccm, for example, from about 500 sccm to about 1,500 sccm. In case the nitrogen-containing hydrocarbon source is a liquid precursor, the nitrogen-containing hydrocarbon source flow can be between 15 mg/min and 2,000 mg/min, for example between 100 mg/min and 1,000 mg/min. In one embodiment, a volumetric flow rate of nitrogen-containing hydrocarbon source:the plasma-initiating gas:dilution gas is in a ratio of, for example about 1:0.5:20, for example about 1:0.2:20, for example about 1:0.8:20, for example about 1:1:20, for example about 1:0.5:30, for example about 1:0.5:40.

During the deposition, the multilayer substrate 117 temperature may be maintained between about 25° C. to about 100° C., to prevent decomposition of the photoresist. The process chamber may be maintained at a chamber pressure about 100 mTorr to about 100 Torr, for example from about 2 Torr to about 15 Torr, for example about 8 Torr or greater, such as about 20 Torr. Plasma may be generated by applying RF power at a power density to substrate surface area of from about 0.001 $W/cm^2$ to about 5 $W/cm^2$, such as from about 0.01 $W/cm^2$ to about 1 $W/cm^2$, for example about 0.04 $W/cm^2$ to about 0.07 $W/cm^2$. The power application may be from about 1 Watt to about 2,000 watts, such as from about 10 W to about 100 W, for a 300 mm substrate. RF power can be either single frequency or dual frequency. A dual frequency RF power application is believed to provide independent control of flux and ion energy since the energy of the ions hitting the film surface influences the film density. The applied RF power and use of one or more frequencies may be varied based upon the substrate size and the equipment used. If a single frequency power is used, the frequency power may be between about 10 KHz and about 30 MHz, for example about 13.56 MHz or greater, such as 27 MHz or 60 MHz. If a dual-frequency RF power is used to generate the plasma, a mixed RF power may be used. The mixed RF power may provide a high frequency power in a range from about 10 MHz to about 60 MHz, for example, about 13.56 MHz, 27 MHz or 60 MHz, as well as a low frequency power in a range of from about 10 KHz to about 1 MHz, for example, about 350 KHz. Electrode spacing, i.e., the distance between a substrate and a showerhead, may be from about 200 mils to about 1000 mils, for example, from about 280 mils to about 300 mils spacing.

The process range as discussed herein provides a deposition rate for a nitrogen-doped conformal carbon layer in the range of about 10 Å/min to about 30,000 Å/min. The as-deposited nitrogen-doped conformal carbon layer may have a carbon:nitrogen ratio that ranges from about 0.1% nitrogen to about 10% nitrogen, such as about 2% to about 6%. In one example, a nitrogen-doped carbon layer includes an elemental composition ranges from about 50% carbon to about 99.9% carbon, and nitrogen ranges from about 0.01% nitrogen to about 25% nitrogen, and hydrogen ranges from about 0% hydrogen to about 25% hydrogen.

As discussed above, at suitable conditions, the energetic plasma, comprising some combination of carbon, nitrogen and hydrogen atoms, reacts with and binds to the surface of patterned photoresist 108 to form a conformal carbon film layer 109. The conformal carbon film layer 109 grows uniformly over the surface of the photoresist 108, and is physically and chemically adhered to the soft carbon surface of photoresist 108. Advantageously, it is believed that the low temperature of deposition and low thermal energy of the photoresist surface lessens desorption of the energetic impinging carbon, nitrogen and hydrogen atoms, thus leading to greater sticking and binding of the atoms to the soft carbon photoresist surface. Not to be bound by theory, it is believed that the chemical bonding of the conformal carbon film to surface of the carbonaceous photoresist may be realized by carbon-carbon bonding, and carbon-nitrogen bonding. The plasma processes performed herein may create an unsatisfied chemical valence and dangling bonds in atoms at the substrate surface, such as a carbon containing photoresist. At the surface, the carbon dangling bonds combine with energetic carbon radicals to form new chemical bonds.

The low temperature methods typically yield higher growth rates of conformal carbon film layer 109 and lower intrinsic carbon layer stresses. By comparison, higher temperature deposits of carbon feature higher stresses due to increased cross-linking, shrinkage, and differences in density, which may lead to delamination of the conformal carbon film layer 109 and distortion of the photoresist 108. Further unexpected advantages in some embodiments are realized by judicious choice of hydrocarbon and nitrogen precursors. For example, propylene and ammonia may produce carbon layers with enhanced adhesion to the patterned photoresist, step coverage and other desirable carbon layer properties. In one example, propylene gas and ammonia gas are introduced into a processing chamber at a volumetric hydrocarbon source and nitrogen source volumetric ratio of between about 50:1 and about 5:1, and wherein the plasma is generated in the processing chamber is delivered at an RF power density between about 0.01 W/cm$^2$ and about 10 W/cm$^2$.

Figure 1E:
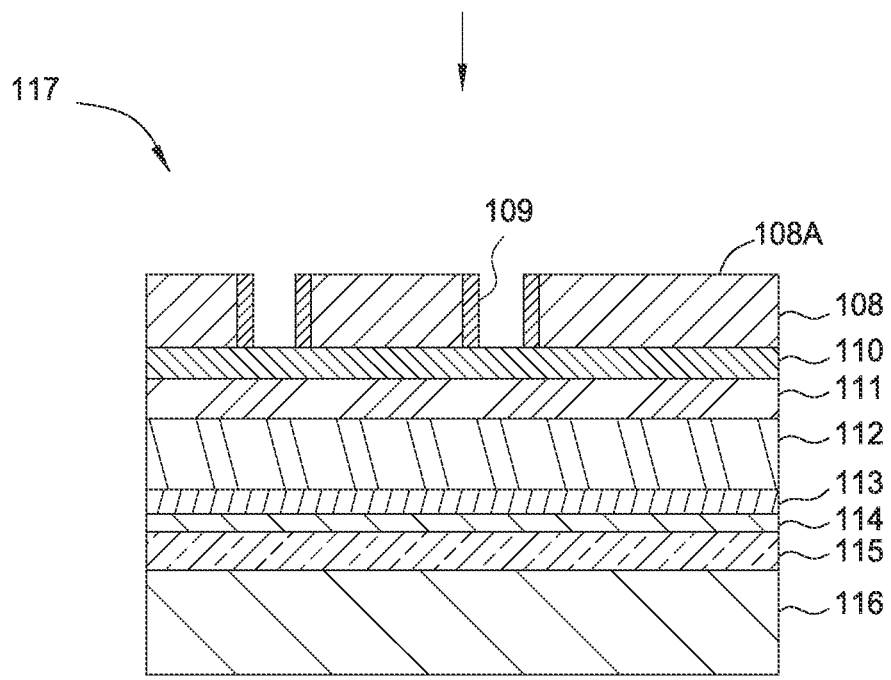

Next, at box 104, the conformal carbon film layer 109 is removed using an anisotropic etch process, as illustrated in FIG. 1E. Here the conformal carbon film layer 109 is removed from the top field region and the bottom of the feature using a plasma etching process. In some embodiments, the selective etching process may be an anisotropic etching process designed to etch material from horizontal surfaces of the substrate only. Such processes may feature a plasma etchant with an electrical bias applied to the substrate to encourage ions in the plasma to accelerate toward the substrate surface, and thus remove the conformal carbon film layer 109 from the bottom as shown in FIG. 1E. At the same time, such a process may also result in substantial removal of the conformal carbon film layer 109 from the field region of the photoresist 108, also illustrated in FIG. 1E. Reactive ion etching using fluorine and oxygen ions is one example of a selective etching process useful for practicing embodiments of the disclosure. Other suitable etching methods, such as etching by non-reactive ions, may also be used.

The pattern transfer hardmask layer 110 may be a hardmask layer derived from a physical vapor deposition process (PVD), and may be comprised of silicon oxide or silicon rich oxide, or PVD SiN or silicon rich SiN, or SiC or silicon rich SiC, or a combination of the preceding including a variation which includes controlled doping of hydrogen into the compounds, heretofore referred to as $SiO_wN_x:H_y$, where w, x, y, can vary in concentration from 0% to 100%. The pattern transfer hardmask layer 110 will serve as an etch mask for subsequent etch sequences, and may be a dielectric layer, anti-reflective layer, or barrier layer, and may possess more than one such property.

The $SiO_wN_x:H_y$ hardmask layer 110 is produced as a hardmask with optical properties that are sufficiently matched to a photoresist 108. Optical properties such as index of refraction (n) and extinction coefficient (k) of hardmask layer 110 are matched to the photoresist 108, so that the interface of the photoresist 108 and hardmask layer 110 does not produce reflections that compromise the lithographic patterning process, which could affect the CD of the formed lithographic pattern. In some embodiments, matching the optical properties of the hardmask and the photoresist allows for multiple sequences of litho, etch, photoresist strip and reapplication of photoresist to be performed directly on the hardmask layer 110. Moreover, since the material from which the hardmask layer 110 is formed is unaffected by the subsequent plasma assisted ashing process that is used to remove the photoresist 108 and conformal carbon film layer 109 layers, and thus allow the subsequent litho, etch, photoresist strip and reapplication of photoresist process cycles to be performed as many times as necessary to from a desirable pattern in the hardmask layer 110. In one embodiment the photoresist 108 and the hardmask layer 110 has a refractive index (n) equal to between 1.6 and 1.7 and an extinction coefficient (k) equal to 0.00 and 0.12 at a wavelength of 193 nm, such as 0.05. As a result, the exposure electromagnetic energy will not reflect or refract at the physical interface of the hardmask layer 110 and the overlying photoresist 108.

One example of a PVD process chamber (e.g., a sputter process chamber) that may be adapted for and suitable for sputter depositing the $SiO_wN_x:H_y$ hardmask layer 110, is an Impulse™ Pulsed DC PVD Dielectric Chamber, available from Applied Materials, Inc., located in Santa Clara, Calif. It is contemplated that other sputter process chambers, including those from other manufactures, may be adapted to practice the present disclosure.

Figure 1F:
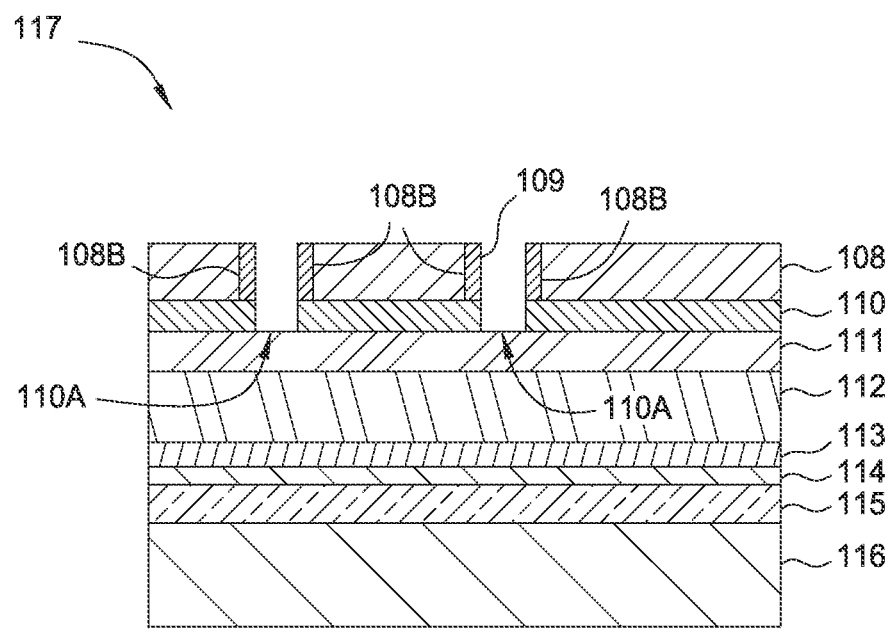

Next, at box 105, as illustrated in FIG. 1F, the conformal carbon film layer 109 deposited on the sidewalls 108B serves as an etching mask for creation of a reduced dimension feature 110A in the hardmask layer 110. The thickness of the conformal carbon film layer 109 on the sidewalls 108B defines the critical dimension (CD) of the pattern etched into hardmask layer 110. For example, if the recess or pattern originally formed in the photoresist is 40 nm wide, a conformal carbon layer 5 nm wide on opposite sidewalls will reduce the width of the pattern etched in the hardmask layer 110 to 30 nm after a directional or anisotropic etch. If the conformal carbon film layer 109 is formed from a material having high etch selectivity with respect to the etchant used to etch the hardmask layer 110, the conformal carbon film layer 109 will only etch slowly or not at all, leaving a reduced dimension feature 110A etched in the hardmask layer 110 as shown in FIG. 1F. Etching of the hardmask layer 110 may be performed by any method known to etch the material of which the hardmask layer 110 is formed, but will preferably be performed by a process that will not significantly etch the conformal carbon film layer 109. A directional etch, such as etching under bias using reactive or non-reactive ions, may be advantageous for preserving the sidewall remnants of the conformal carbon film layer 109 while etching the reduced dimension pattern in the hardmask layer 110. The directional selective etching process may be a directional or anisotropic etching process designed to etch material from horizontal surfaces of the substrate only. Such processes may feature a plasma etchant with an electrical bias applied to the substrate to encourage ions in the plasma to accelerate toward the substrate surface. In such processes, the accelerated ions will generally travel deep into the pattern recess such that a vast majority of reactive species impact the bottom portion of the recess as shown in FIGS. 1E-1F. Reactive ion etching using fluorine and oxygen ions is one example of a selective etching process useful for practicing embodiments of the disclosure. Other etching methods, such as etching by non-reactive ions, may also be used.

Figure 1G:
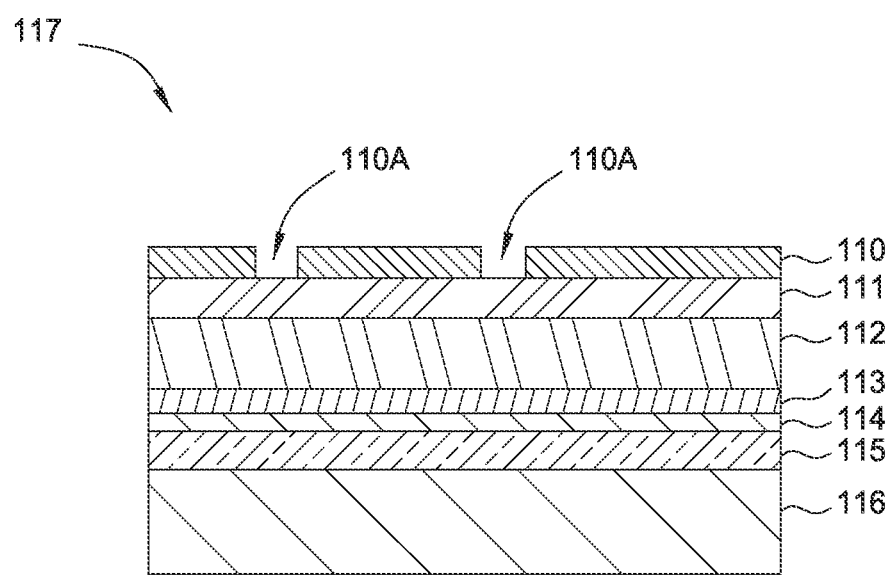
Figure 1H:
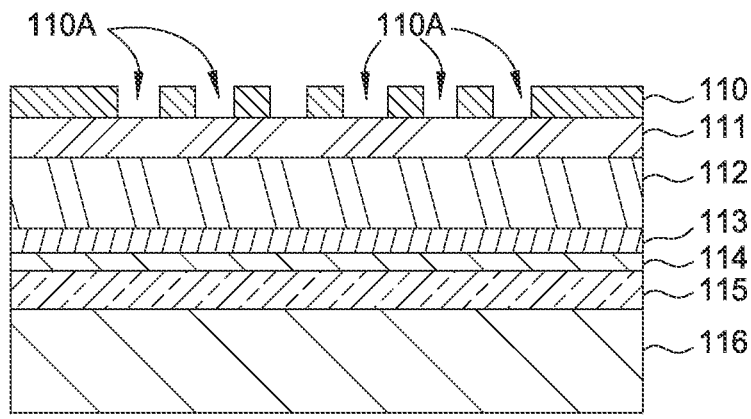

Next, at box 106, as illustrated in FIG. 1G, a dry plasma ashing process is advantageously used for the simultaneous removal of the carbonaceous conformal carbon film layer 109 and photoresist 108. In some embodiments, the carbonaceous conformal carbon film layer 109 is formed so that the material removal rate during the ashing process is substantially similar to the removal rate of the photoresist 108 during the ashing process. As shown in FIG. 1A, boxes 101-106, this process can be repeated multiple times to create multiple reduced dimension features 110A in the hardmask layer 110, as illustrated in FIG. 1H.

Figure 1I:
Figure 1I:
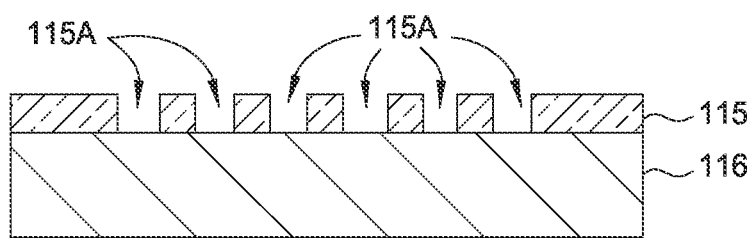

At box 107 multiple operations are performed to achieve the reduced dimension in the active layer 115 disposed over substrate 116 in FIG. 1I. Active layer 115 may be described as the active layer comprised of reduced dimension lines and vias (e.g., item 115A) that are patterned in a dielectric material. As described herein, the method 100 may be useful in generating patterns having critical dimension smaller than the capability of a particular lithography apparatus or process.

Figure 2A:
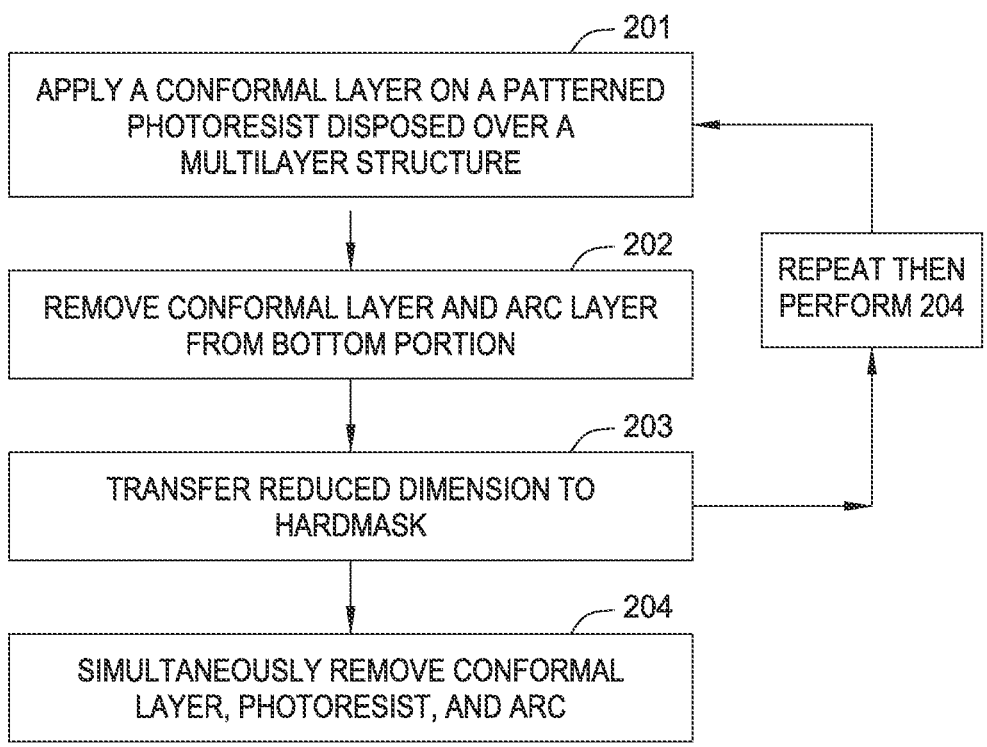
FIG. 2A is a flowchart depicting operations associated with a patterning process according to one embodiment of the disclosure.
Figure 2B:
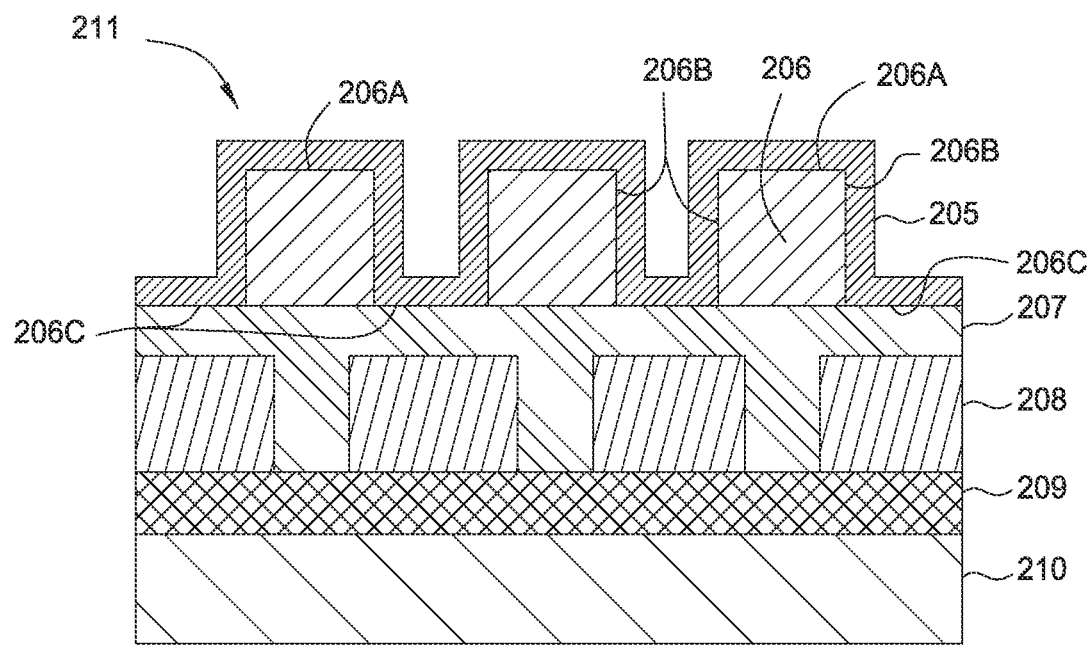
FIGS. 2B-2E illustrate cross-sectional views representing an exemplary patterning process as set forth by FIG. 2A according to an embodiment of the disclosure.

Method 200 represents a process scheme related to method 100 and yields a hardmask 208 that is used to create reduced dimensions in the device active layer 115 that may comprise lines and vias, as previously described. For brevity, photoresist deposition and patterning are not shown in method 200, but will include the processes performed in boxes 101 and 102 discussed above. Herein, FIG. 2A is a flow diagram illustrating a method 200 according to one embodiment of the disclosure. FIGS. 2B-2E represent cross-sectional views of the patterning process as described in FIG. 2A, and show a multilayer substrate 211 at various stages of the method 200. FIG. 2B illustrates a number of possible layers comprising multilayer substrate 211. A notable addition is the anti-reflective carbonaceous ARC layer 207.

In method 200, the multilayer substrate 211 is provided to a plasma processing chamber, wherein the multilayer substrate 211 resides on a temperature controlled substrate holder or chuck. The multilayer substrate 211 is equilibrated to a temperature less than the decomposition temperature of the photoresist 206. The conformal carbon layer 205 is deposited over the field region 206A and sidewalls 206B and bottom recess 206C of the patterned photoresist 206, as shown in FIG. 2B, and per box 201. The photoresist 206 is thus disposed over the anti-reflective carbonaceous (ARC) layer 207, which is deposited over the hardmask 208. The hardmask 208 may comprise $SiO_wN_x:H_y$, and have optical properties that are sufficiently matched to a photoresist 206. The hardmask 208 may then be patterned by the methods described previously in boxes 101-107. In some configurations, etch stop layer 209 may be a hardmask layer.

The ARC layer 207 may be an organic material represented by the polyamides and polysulfones, which are typically deposited by spin coating techniques. ARC materials typically include chromophoric structures which are capable of absorbing the radiation wave lengths which are likely to be reflected back from a device substrate during pattern imaging of a photoresist, and, by this mechanism, reduce or eliminate the deleterious effects of reflections from the underlying surface.

Figure 2C:
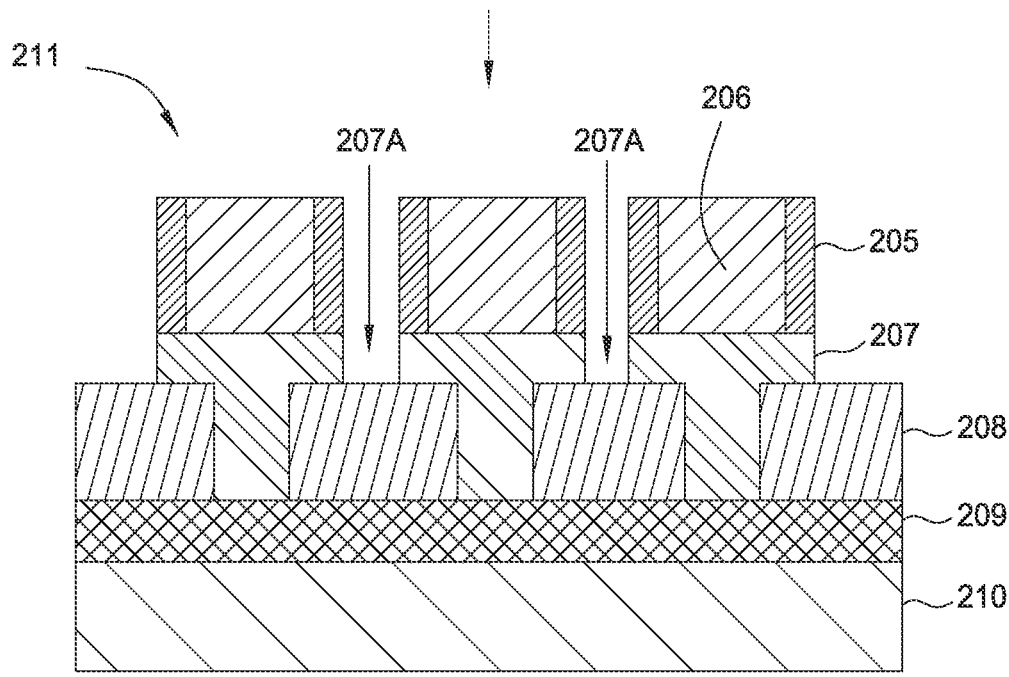

At box 202, an anisotropic plasma etching process is performed to remove the conformal carbon layer 205 from the top field region 206A and/or the bottom recess 206C, as well as removal of a portion of the carbonaceous ARC layer 207A, that is disposed over the patterned hardmask 208 as illustrated in FIG. 2C. As previously described, the selective etching process may be an anisotropic etching process designed to selectively etch material from surfaces of substrates.

Figure 2D:
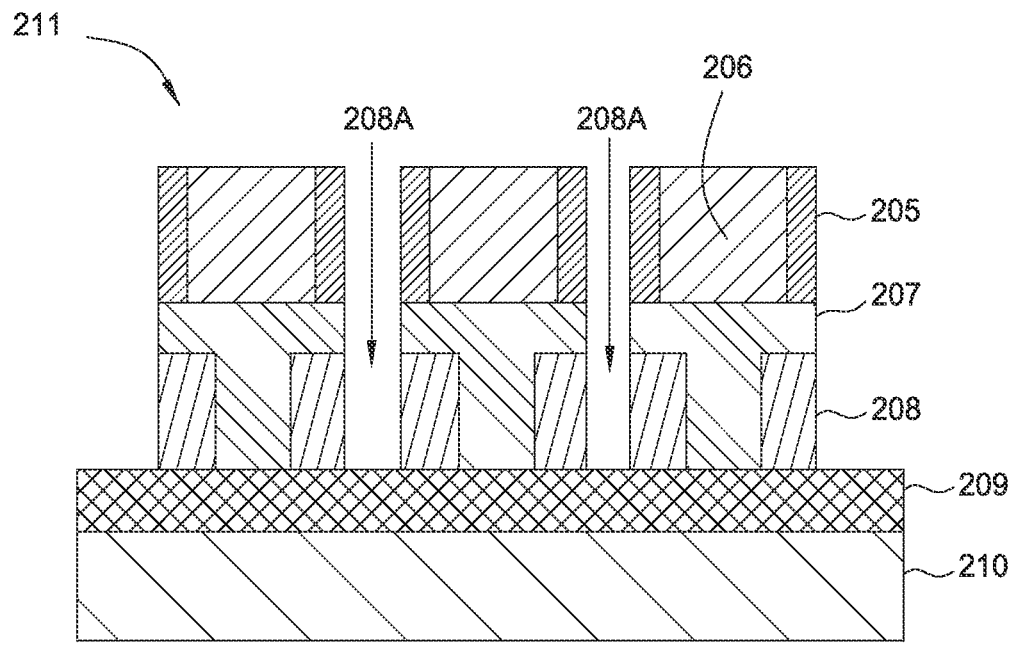

Next, at box 203, as illustrated in FIG. 2D, an anisotropic etch process transfers a reduced dimension pattern to the hardmask 208. At box 203 a removed portion 208A is removed from the hardmask 208 layer. The etch stop layer 209 protects the underlying substrate 210 from etching during the processes performed during box 203.

Figure 2E:
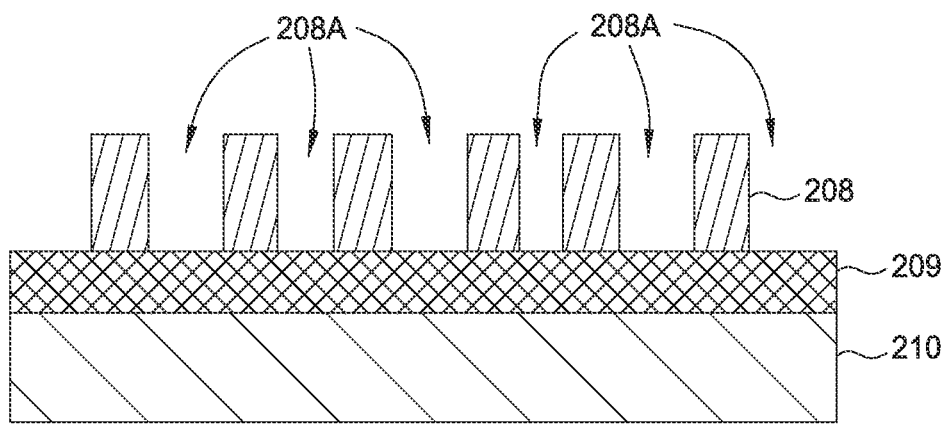

Next, at box 204, as illustrated in FIG. 2E, the three carbonaceous layers (205-207) are simultaneously and expeditiously removed by a plasma ashing process to reveal the underlying patterned hardmask 208 having the removed portions 208A formed therein. The operations represented by boxes 201 to 203 may be repeated until the desired feature pitch in the hardmask 208 is realized. The general process thus described in method 200 may be useful in generating patterns having critical dimensions smaller than the capability of a particular lithography apparatus, and integrates the use of dimension shrinking conformal carbon layer 205.

In other embodiments of this disclosure, the multilayer substrate(s) 117, 211 may feature other layers deposited by PVD, to complement the PVD deposited $SiO_wN_x:H_y$ hardmask layer 110. For example, ARC layer 111 in FIG. 1B is deposited by PECVD or by a spin-on process. ARC layer 111 may be replaced by a new PVD dielectric layer, while still retaining the optical planarization spin-on carbon layer 112.

Figure 3A:
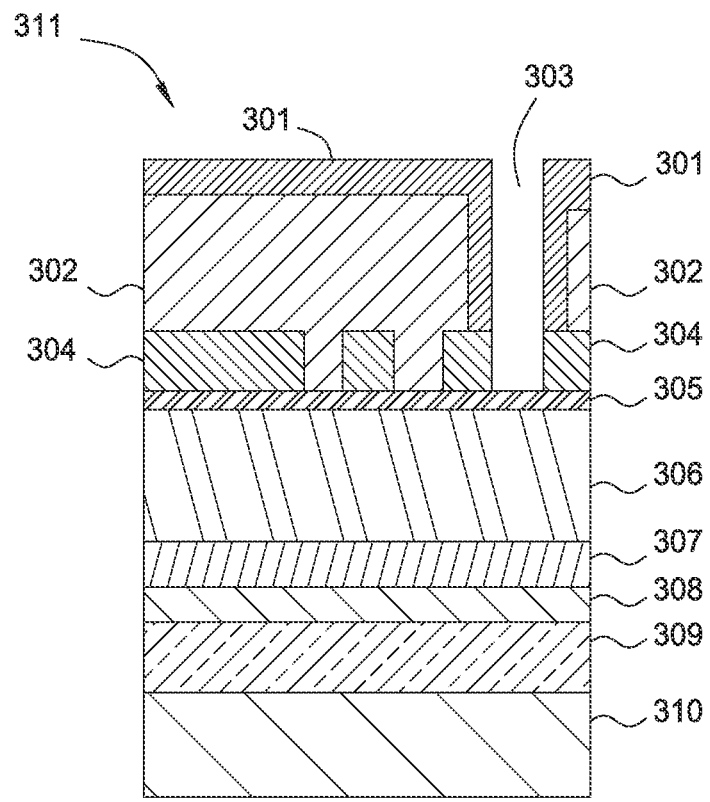
FIGS. 3A and 3B illustrate cross-sectional views representing exemplary multilayer structures that may be formed according to an embodiment disclosed herein.
Figure 3B:
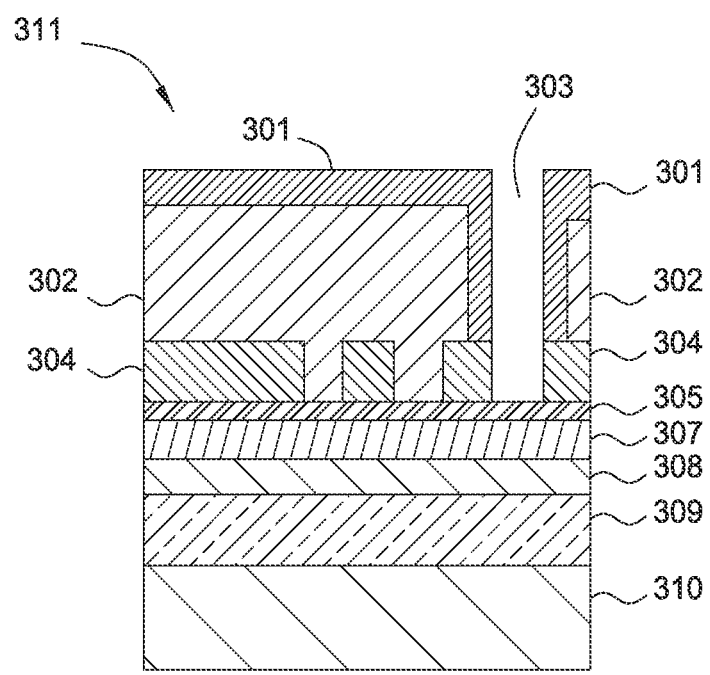

FIGS. 3A and 3B illustrate a reduced dimension pattern formed in a hardmask that is optically matched to an overlying photoresist layer. The application of a dimension shrinking conformal carbon layer over the field region, sidewalls, and bottom portion of the patterned photoresist and the underlying hardmask may be at temperatures below the decomposition temperature of the photoresist. Additionally, removal of the conformal carbon layer from the bottom portion of the patterned photoresist and the hardmask may be performed by an etch process to expose the hardmask, etching the exposed hardmask substrate at the bottom portion, followed by the simultaneous removal of the conformal carbon layer, the photoresist, and other carbonaceous components. As shown in FIGS. 3A and 3B, a hardmask with reduced dimension features for further pattern transfer may be yielded.

Furthermore, FIGS. 3A and 3B illustrate a multilayer substrate 311 having a low temperature conformal strippable organic layer directly deposited on a photoresist layer. The use of an organic layer allows for the organic material to be stripped away in a dry oxygen based plasma at the same time as a photoresist strip process. As shown in FIGS. 3A and 3B, in certain embodiments, the multilayer substrate 311 may include a substrate 310, an active layer 309 disposed over the substrate 310, and an oxide layer 308 formed on the active layer 309. The multilayer substrate 311 may also include a titanium nitride hardmask layer 307 formed on the oxide layer 308, a spin on carbon layer 306 formed on the titanium nitride hardmask layer 307, a multipurpose PVD dielectric layer 305, a hardmask layer 304, a photoresist layer 302 disposed over the hardmask layer 304, and a photoresist shrink layer 301 overlying the photoresist layer 302. Furthermore, an opening 303 may be formed in the photoresist shrink layer 301. The photoresist shrink layer 301 is formed using a process similar to the processes described above in conjunction with the conformal carbon film layer 109 and/or conformal carbon layer 205.

This and other related embodiments are now shown in FIG. 3A that illustrates a multilayer substrate 311, wherein, in one example, the new multipurpose PVD dielectric layer 305 replaces aforementioned PECVD or spin-on ARC layer 111. The new multipurpose PVD dielectric layer 305 may also involve replacing two or more layers with a multipurpose PVD dielectric layer 305, which may have tunable properties that may serve as a combined ARC, etch stop, and ashing barrier. In some embodiments both ARC layer 111 and the spin-on carbon layer 112 of FIG. 1B are replaced by the multipurpose PVD dielectric layer 305 of FIG. 3B, which may serve as a combined ARC, etch stop, and ashing barrier. However, in another embodiment, a spin on carbon layer 306 may be present, as shown in FIG. 3A.

Utilizing the operations described in method 200 as well as in FIG. 2A, multiple layer stacks may be formed on the substrate 310 as shown in FIG. 3A and FIG. 3B. FIGS. 3A-3B illustrate cross-sectional views representing exemplary multilayer structures formed on the substrate 310. As shown in FIG. 3A, active layer 309 may disposed over the substrate 310. Active layer 309 may be substantially similar to active layer 115 of FIG. 1G. Active layer 309 may be processed to connected to reduced dimension metal lines and/or vias that are formed in a dielectric material. As shown in FIGS. 3A-3B, an oxide layer 308 may be formed on the active layer 309. Furthermore, a titanium nitride hardmask layer 307 may be formed on the oxide layer 308.

The photoresist layer 302 may be disposed over the hardmask layer 304 and patterned using a lithography type process. The photoresist layer 302 may be a polymer material sensitive to a certain wavelength of electromagnetic radiation, and may be applied through a spin coating process or a CVD process. In some embodiments, the photoresist layer 302 is a carbon-based polymer sensitive to ultraviolet light, such as a phenolic resin, an epoxy resin, or an azo napthenic resin. The photoresist layer 302 may be a positive or a negative photoresist. The hardmask layer 304 may be similar to the hardmask layer 110 described above. The photoresist layer 302 is formed using a process similar to the processes described above in conjunction with the photoresist 108 and photoresist 206.

A reduced dimension pattern may be formed in the hardmask layer 304 that is optically matched to the overlying photoresist layer 302. A photoresist shrink layer 301 may overlie the photoresist layer 302. The photoresist layer 302 and photoresist shrink layer 301 may be used to pattern and form features in the various layers of the device stack, as shown in FIGS. 3A-3B. Furthermore, removal of the conformal carbon layer 306 from the bottom portion of the patterned photoresist layer 302 and the hardmask layer 304 by an etch process may expose the titanium nitride hardmask layer 307 via an opening 303 formed therein, thus yielding a hardmask with reduced dimension features for further pattern transfer.

Advantages are realized from the aforementioned embodiments involving the replacement of the ARC layer 111 and the spin-on carbon layer 112 by a multipurpose PVD dielectric layer 305. In some embodiments, a PVD deposited $SiO_w N_x$: $H_y$, hardmask layer 304, and the multipurpose PVD dielectric layer 305 may be deposited using the same PVD process chamber or tool, and may utilize similar deposition parameters and precursors. The sequential in-situ deposition of more than one PVD layer thus described eliminates the separate PECVD and spin-on processes that may be used to form the ARC layer 111 and the spin-on carbon layer 112.

The multipurpose PVD dielectric layer 305 is deposited at low temperatures and features high purity and density, tunable index of refraction, elimination of amines that poison the photoresist layer 302, and acceptable performance at thicknesses approaching 4 nm. Multipurpose PVD dielectric layer 305 may serve as a combined ARC, etch stop, and ashing barrier. The etch stop and etch selectivity of PVD dielectrics such as multipurpose PVD dielectric layer 305 are tunable as well, and thus integrate with process schemes involving the multilayer substrate 311 and others thus contemplated. Overetching into sub-layers may be circumvented by multipurpose PVD dielectric layer 305. Suitable materials contemplated for the multipurpose PVD dielectric layer 305 include, but are not restricted to: $SiO_w N_x$:$H_y$, silicon nitride, titanium nitride, aluminum nitride, aluminum oxynitride, amorphous silicon, tantalum oxides, and titanium oxides. A PVD process chamber (e.g., a sputter process chamber) that may be adapted for and suitable for sputter depositing the multipurpose PVD dielectric layer 305, includes the Impulse™ Pulsed DC PVD Dielectric Chamber, available from Applied Materials, Inc., located in Santa Clara, Calif. It is contemplated that other sputter process chambers, including those from other manufactures, may be adapted to practice the present disclosure.

Figure 4:
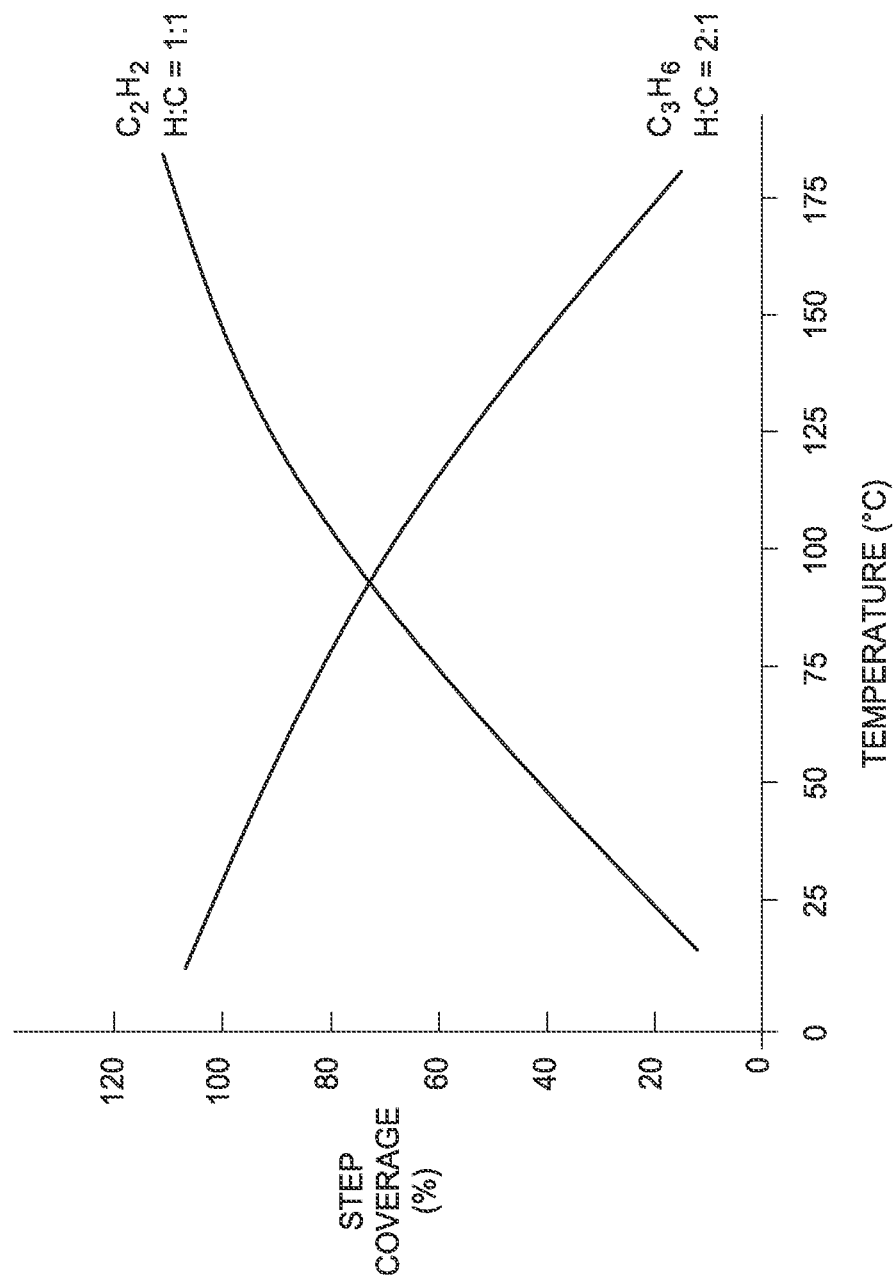
FIG. 4 is a plot of step coverage versus temperature for various different hydrocarbon containing precursors according to an embodiment described herein.

For the methods and embodiments described in conjunction with any of the methods described herein, a unique and unexpected result was realized using hydrocarbons that have a hydrogen to carbon (H:C) ratio of at least 2:1 to form the conformal carbon layer, due to the bonding structure of these types of hydrocarbon materials. As shown in FIG. 4, an inverse relationship for step coverage versus temperature was discovered, wherein the step coverage and attendant conformality increased with decreasing temperature. In one example, propylene ($C_3H_6$) that has a H:C ratio of 2:1, unexpectedly yielded increasing conformality and step coverage at temperatures below 100° C., in contrast to those precursors with an H:C ratio 1:1. In another example, propylene ($C_3H_6$), when combined with the nitrogen precursor ammonia, produced a carbon layer with excellent adhesion, conformality, and the step coverage versus temperature relationship as illustrated in FIG. 4.

The inverse relationship of step coverage versus temperature, for the deposition of conformal carbon layers from a hydrocarbon having an H:C ratio of 2:1 or more, such as propylene, over a photoresist, is an enabling factor for the retention and preservation of the photoresist patterned dimensions and chemical and physical properties, as the deposition of the conformal carbon layer is practiced well below the decomposition temperature of the photoresist.

The unexpected results discussed above, combined with the methods and embodiments described in this disclosure, generally yield a carbon layer deposited over a photoresist with good conformality, step coverage, low stress, good adhesion to the photoresist, and high etch selectivity. Further, the carbon layer and photoresist may be simultaneously removed by dry ashing processes, thus enabling more efficient process schemes not previously envisioned.

While the foregoing is directed to embodiments of the disclosure, other and further embodiments of the disclosure may be devised without departing from the basic scope thereof, and the scope thereof is determined by the claims that follow.

The invention claimed is:

1. A method of forming a reduced dimension pattern in a hardmask comprising:
    forming a patterned photoresist layer on a hardmask layer;
    depositing a conformal carbon layer on the patterned photoresist by a plasma process, wherein the conformal carbon layer is disposed over a field region and sidewalls and a bottom portion of a feature formed in the patterned photoresist, and wherein the hardmask layer comprises a $SiO_wN_x:H_y$ material, and wherein the optical properties of the hardmask layer are tuned so that the hardmask layer appears optically flat at the exposure wavelength of the photoresist;
    removing the conformal carbon layer from the bottom portion by an etch process to expose a portion of the hardmask layer;
    etching the exposed portion of the hardmask layer to form a recess in the hardmask layer; and
    removing the remaining portions of the conformal carbon layer and patterned photoresist layer simultaneously by a plasma ashing method.

2. The method of claim 1, wherein the photoresist has a refractive index between 1.6 and 1.7 and a coefficient of extinction is between 0.00 and 0.12 at a wavelength of 193 nm.

3. A method of claim 1, wherein deposition of the conformal carbon layer is performed at a temperature less than the degradation temperature of the photoresist.

4. A method of claim 3, wherein the temperature is less than 100° C.

5. A method of claim 3, wherein the temperature is less than 50° C.

6. The method of claim 1, wherein the conformal carbon layer comprises a nitrogen-doped amorphous carbon material.

7. The method of claim 6, wherein the nitrogen-doped amorphous carbon material bonds to the patterned photoresist, and wherein the dimensions and physical and chemical properties of the photoresist remain substantially unchanged after the conformal carbon layer is deposited.

8. A method of claim 1, wherein removing the conformal carbon layer and photoresist comprises simultaneously removing the conformal carbon layer and the patterned photoresist using a dry plasma ashing process.

9. A method of claim 1, wherein removing the conformal carbon layer and photoresist comprises removing a carbon containing anti-reflective layer using a dry plasma ashing process.

10. A method of forming a reduced dimension pattern on a hardmask comprising:
    providing a substrate comprising a patterned photoresist on a hardmask to a plasma chamber;
    introducing propylene gas, ammonia gas, a plasma-initiating gas, and a dilution gas into the processing chamber, wherein a volumetric flow rate of the hydrocarbon source and the nitrogen source is in a ratio from about 50:1 to about 5:1;
    generating a plasma in the processing chamber, wherein the plasma is generated by applying RF power at a power density of from about 0.01 W/cm² to about 10 W/cm²; and
    depositing a conformal carbon layer comprising nitrogen-doped amorphous carbon over the patterned photoresist and the hardmask, wherein the photoresist and a surface of the hardmask each have a refractive index between 1.6 and 1.7 and the coefficient of extinction is between 0.00 and 0.12 at a wavelength of 193 nm, and the hardmask comprises $SiO_wN_x:H_y$, and wherein the substrate temperature is maintained at less than 100° C. while depositing the conformal carbon layer.

11. The method of claim 10, wherein the carbon and hydrogen sources comprise of aliphatic hydrocarbons generally selected from alkanes, alkenes, and alkynes.

12. The method of claim 11, wherein the carbon and hydrogen sources comprise of aliphatic hydrocarbons selected from alkanes, alkenes, and alkynes further comprised of hydrogen to carbon atomic ratio of at least 2:1.

13. The method of claim 10, wherein carbon, hydrogen and nitrogen sources are comprised of hydrocarbons containing at least one chemical bond to nitrogen.

14. The method of claim 10, wherein the nitrogen sources are comprised of inorganic nitrogen sources.

15. The method of claim 14, wherein the nitrogen sources are comprised of ammonia.

16. The method of claim 10, wherein the hydrocarbon and nitrogen sources comprise propylene and ammonia.

17. The method of claim 10, wherein the nitrogen-doped carbon layer percent elemental composition ranges from about 50% carbon to about 99.9% carbon, and nitrogen ranges from about 0.01% nitrogen to about 25% nitrogen, and hydrogen ranges from about 0% hydrogen to about 25% hydrogen.

18. A method of forming a reduced dimension pattern on a hardmask comprising:
    providing a substrate comprising a patterned photoresist on a hardmask to a plasma chamber; wherein the substrate temperature is maintained at less than 100° C.;
    introducing propylene gas, ammonia gas, a plasma-initiating gas, and a dilution gas into the processing chamber; wherein a volumetric flow rate of the hydrocarbon source and the nitrogen source is in a ratio from about 50:1 to about 5:1;
    generating a plasma in the processing chamber, wherein the plasma is generated by applying RF power at a power density of from about 0.01 W/cm² to about 10 W/cm²; and
    depositing a conformal carbon layer comprised of nitrogen-doped amorphous carbon layer over the field region, sidewalls, and a bottom portion of the pattern formed by the patterned photoresist and the hardmask, wherein the photoresist has a refractive index between 1.6 and 1.7 and the coefficient of extinction is between 0.00 and 0.12 at a wavelength of 193 nm, and the hardmask, of the general chemical formula $SiO_wN_x:H_y$, and wherein the hardmask optical properties sufficiently match the optical properties of the photoresist, at a lithography exposure wavelength of the photoresist.

19. The method of claim 18, wherein the substrate provided to the plasma chamber further comprises of a dielectric layer derived from a physical vapor deposition method that serves as a combined anti-reflective, etch stop, and ashing barrier.

* * * * *